(12) United States Patent
Asamura

(10) Patent No.: US 8,896,388 B2
(45) Date of Patent: Nov. 25, 2014

(54) TEMPERATURE-COMPENSATED CRYSTAL OSCILLATOR

(75) Inventor: Fumio Asamura, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 13/569,183

(22) Filed: Aug. 8, 2012

(65) Prior Publication Data

US 2013/0038400 A1    Feb. 14, 2013

(30) Foreign Application Priority Data

Aug. 11, 2011    (JP) ................. 2011-175634

(51) Int. Cl.
| | |
|---|---|
| *H03B 5/32* | (2006.01) |
| *H03L 1/02* | (2006.01) |
| *H03C 3/22* | (2006.01) |
| *H03B 5/36* | (2006.01) |

(52) U.S. Cl.
CPC ................ *H03B 5/368* (2013.01); *H03L 1/025* (2013.01); *H03B 2200/0012* (2013.01); *H03B 2200/0034* (2013.01); *H03L 1/028* (2013.01)
USPC .................. 331/158; 331/176; 331/177 V

(58) Field of Classification Search
USPC ............ 331/36 C, 108 C, 154, 158, 175, 176, 331/177 V, 186
See application file for complete search history.

(56) References Cited

U.S. PATENT DOCUMENTS

| | | | | |
|---|---|---|---|---|
| 5,041,799 A | * | 8/1991 | Pirez | 331/44 |
| 5,731,742 A | * | 3/1998 | Wojewoda et al. | 331/44 |
| 5,999,063 A | * | 12/1999 | Sakurai et al. | 331/158 |
| 6,040,744 A | * | 3/2000 | Sakurai et al. | 331/176 |
| 6,362,699 B1 | * | 3/2002 | Fry | 331/176 |
| 6,522,212 B1 | * | 2/2003 | Kodim | 331/176 |
| 6,570,461 B1 | * | 5/2003 | Fry et al. | 331/176 |
| 6,731,181 B2 | * | 5/2004 | Fukayama et al. | 331/176 |
| 7,023,290 B2 | * | 4/2006 | Kubo et al. | 331/158 |
| 7,292,117 B2 | * | 11/2007 | Ishikawa et al. | 331/176 |
| 7,639,092 B2 | * | 12/2009 | Shen et al. | 331/36 C |
| 7,649,426 B2 | * | 1/2010 | Stolpman | 331/176 |
| 7,675,377 B2 | * | 3/2010 | Yamamoto | 331/177 V |
| 7,911,285 B2 | * | 3/2011 | Terada et al. | 331/158 |

FOREIGN PATENT DOCUMENTS

| | | |
|---|---|---|
| JP | 2004-104609 | 4/2004 |
| JP | 2005-033329 | 2/2005 |

* cited by examiner

*Primary Examiner* — Levi Gannon
(74) *Attorney, Agent, or Firm* — Jianq Chyun IP Office

(57) ABSTRACT

A temperature-compensated crystal oscillator includes a crystal resonator; and an oscillator circuit for performing temperature compensation. The oscillator circuit has a temperature sensor unit that measures an ambient temperature of the crystal resonator, a temperature compensation unit that outputs a first voltage for temperature compensation based on the measured temperature, a high-temperature load capacitance adjustment unit that outputs a second voltage for temperature compensation based on the temperature measured in a high temperature area exceeding a particular temperature range, an oscillator unit having first and second variable capacitance elements used for temperature compensation within a particular temperature range, third and fourth variable capacitance elements used for temperature compensation in the high temperature area, and an oscillation integrated circuit (IC) connected to the crystal resonator to perform an oscillation operation, and a buffer that amplifies the output from the oscillator unit.

5 Claims, 6 Drawing Sheets

OSCILLATION FREQUENCY
Fout WITHOUT TEMPERATURE
COMPENSATION (TEMPERATURE
CHARACTERISTICS OF CRYSTAL
RESONATOR AND OSCILLATOR
CIRCUIT)

FIG.3A

IDEAL TEMPERATURE
COMPENSATION
VOLTAGE V1

FIG.3B

REALISTIC TEMPERATURE
COMPENSATION VOLTAGE
V1

FIG.3C

LOAD CAPACITANCE
CORRECTION
VOLTAGE V2

FIG.3D

OSCILLATION FREQUENCY
Fout AFTER TEMPERATURE
COMPENSATION PROPOSED
HEREIN

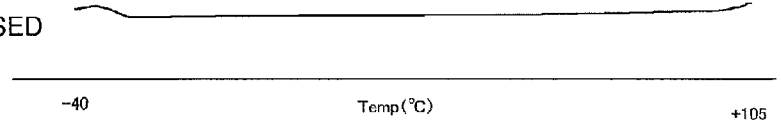

−40          Temp(°C)          +105

FIG.3E

OSCILLATION FREQUENCY
Fout WITHOUT TEMPERATURE
COMPENSATION (TEMPERATURE
CHARACTERISTICS OF CRYSTAL
RESONATOR AND
OSCILLATOR CIRCUIT)

IDEAL TEMPERATURE
COMPENSATION
VOLTAGE V1

REALISTIC TEMPERATURE
COMPENSATION VOLTAGE
V1

OSCILLATION FREQUENCY
Fout AFTER REALISTIC
TEMPERATURE
COMPENSATION

TEMPERATURE-COMPENSATED CRYSTAL OSCILLATOR

CROSS REFERENCE TO RELATED APPLICATIONS

This application claims the priority benefit of Japan application serial no. 2011-175634, filed on Aug. 11, 2011. The entirety of the above-mentioned patent application is hereby incorporated by reference herein and made a part of this specification.

BACKGROUND OF THE INVENTION

1. Field of the Invention

This disclosure relates to a temperature-compensated crystal oscillator, and more particularly, to a temperature-compensated crystal oscillator capable of improving temperature compensation accuracy even in a high temperature without increasing a sensitivity of a voltage controlled oscillator.

2. Description of Related Art

<Temperature-Compensated Crystal Oscillator in Prior Art: FIG. 4>

A temperature-compensated crystal oscillator (TCXO) in prior art will be described with reference to FIG. 4. FIG. 4 is a circuit block diagram illustrating a temperature-compensated crystal oscillator in prior art. The TCXO in prior art includes an oscillator circuit 1 and a crystal resonator 2 as illustrated in FIG. 4.

The oscillator circuit 1 includes an input terminal (AFC terminal) that receives an external reference signal, an automatic frequency control unit (AFC: Automatic Frequency Control) 11, an oscillator unit (OSC) 12, an output buffer unit (OUT BUFFER) 13, a temperature sensor unit (TEMP SENSOR) 14, a temperature compensation unit (FUNC) 15, a nonvolatile memory (NVM) 16, and a constant voltage power source (REG) 17.

The automatic frequency control unit 11 controls a sensitivity (voltage gain) for the external reference signal input from the AFC terminal and outputs it to the oscillator unit 12. The oscillator unit 12 outputs a signal oscillating using the crystal resonator 2 and the sensitivity-controlled voltage (AFC) to the output buffer unit 13. The output buffer unit 13 buffers (amplifies) the oscillation signal from the oscillator unit 12 and outputs it to the output terminal (OUT terminal). Here, the output buffer unit 13, the crystal resonator 2, and the oscillator unit 12 constitute a voltage-controlled crystal oscillator (VCXO).

The temperature sensor unit 14 measures an ambient temperature of the crystal resonator 2 and outputs it to the temperature compensation unit 15. The temperature compensation unit 15 is a circuit for generating a function. The temperature compensation unit 15 reads a parameter for temperature compensation stored in the nonvolatile memory 16, performs computation based on the parameter and the measurement temperature value input from the temperature sensor unit 14, and outputs a temperature-compensated voltage to the oscillator unit 12. The oscillator unit 12 supplies the signal oscillating using the crystal resonator 2 along with the signal from the AFC 11 and the compensation voltage output from the temperature compensation unit 15.

<Circuit of Temperature-Compensated Crystal Oscillator in Prior Art: FIG. 5>

Next, a circuit of the temperature-compensated crystal oscillator in prior art of FIG. 4 will be described with reference to FIG. 5. FIG. 5 is a circuit diagram illustrating the temperature-compensated crystal oscillator in prior art. Comparing FIGS. 4 and 5 regarding the temperature-compensated crystal oscillator in prior art, the crystal resonator 2 corresponds to the crystal resonator X. The output buffer unit 13 corresponds to the buffers 32 and 33, the resistor R3, and the capacitor C3. The oscillator unit 12 corresponds to the inverter IC31, the resistors Rf, R1, and R2, the capacitors C1 and C2, and the variable capacitance diodes VD1 and VD2.

In FIG. 5, the automatic frequency control unit 11 and the constant voltage power source 17 of FIG. 4 are omitted. It is noted that the output from the automatic frequency control unit 11 is input to the terminal V1T of FIG. 5.

In the aforementioned temperature-compensated crystal oscillator in prior art, typically, temperature compensation is performed within a range of −40 to +85° C. In recent years, in Europe, an act for compelling an emergency call such as e-call was legislated, and introduction of the related equipment is in progress. For use in a vehicle, the TCXO is required to operate across a wide temperature range, for example, −40 to +105° C.

There is no problem in a typical temperature compensation range (i.e., −40 to +85° C.). However, there are some problems as described below in a wide temperature range (e.g., −40 to +105° C.), particularly, a temperature range of +86 to +105° C.

<Example of Temperature Compensation in Prior Art: FIGS. 6A-6D>

An example of temperature compensation in prior art will be described with reference to FIGS. 6A to 6D. FIGS. 6A to 6D are explanatory diagrams illustrating an example of temperature compensation in prior art. In FIGS. 6A to 6D, the abscissa denotes a temperature (Temp), and the ordinate denotes a frequency characteristic in FIGS. 6A and 6D or a voltage characteristic in FIGS. 6B and 6C. FIG. 6A illustrates a characteristic of the "oscillation frequency Fout without temperature compensation." This characteristic is a frequency characteristic depending on the temperature characteristics of the crystal resonator and the oscillator circuit.

FIG. 6B illustrates a voltage characteristic of an ideal temperature compensation voltage V1, and FIG. 6C illustrates a voltage characteristic of a realistic temperature compensation voltage V1. If the voltage characteristic V1 for the ideal temperature compensation voltage of FIG. 6B is applied to the oscillation frequency of the voltage-controlled crystal oscillator without temperature compensation of FIG. 6A, the oscillation frequency after the ideal temperature compensation becomes flat.

However, a deviation occurs in a high temperature area between the frequency characteristic for the ideal temperature compensation voltage and the frequency characteristic for the realistic temperature compensation voltage. Due to such a deviation, if the voltage characteristic V1 for the realistic temperature compensation voltage of FIG. 6C is applied to the oscillation frequency of the voltage-controlled crystal oscillator without temperature compensation of FIG. 6A, the oscillation frequency after the realistic temperature compensation of FIG. 6D basically becomes flat, but it abruptly rises in a high temperature area. That is, in the high temperature area, the temperature compensation is not normally performed.

In addition, in the TCXO in prior art, a power voltage of the TCXO has been lowered by highly integrating the employed integrated circuit (IC) and advancing miniaturization in the process. For example, the power voltage has been lowered from 5 V to 3.3 V and from 3.3 V to 1.8 V.

<Related Techniques>

As the related techniques, there are disclosed: "Temperature-compensated Piezo-oscillator" in Japanese Patent Application Laid-open No. 2004-104609, assigned to TOYO Communication Equipment Co., Ltd.; and "Temperature-compensated Piezo-oscillator" in Japanese Patent Application Laid-open No. 2005-033329, assigned to CITIZEN WATCH Co. Ltd.

Japanese Patent Application Laid-open No. 2004-104609 discloses a temperature-compensated piezo-oscillator in which a temperature variation is applied to the variable capacitance diode as a voltage variation by integrating a variable capacitance diode into a frequency/temperature compensation circuit, a capacitance is changed based on that voltage such that the capacitance decreases to increase the frequency, and the capacitance increases to decrease the frequency.

Japanese Patent Application Laid-open No. 2005-033329 discloses a temperature-compensated piezo-oscillator including a crystal oscillator circuit having a low-temperature MOS capacitance element and a high-temperature MOS capacitance element connected to each other in parallel, a low-temperature bias signal generating circuit, and a high-temperature bias signal generating circuit, so that temperature compensation for a low-temperature area and temperature compensation for a high temperature area are independently performed.

However, in the TCXO in prior art, as the power voltage is lowered, an internal voltage is reduced, and a dynamic range of the circuit voltage is narrowed. As a result, a temperature compensation voltage range for the voltage applied to the voltage-controlled crystal oscillator (VCXO) is narrowed, and a temperature range that can be compensated is narrowed.

In this regard, it is conceivable that this problem may be addressed by increasing a frequency-to-voltage sensitivity of the VCXO. However, in such a countermeasure, a noise sensitivity also increases, so that a phase noise as an important characteristic required in the TCXO may be degraded.

Both the temperature-compensated piezo-oscillators disclosed in Japanese Patent Application Laid-open Nos. 2004-104609 and 2005-033329 are designed to perform temperature compensation using a high-temperature compensation circuit in a high temperature and using a low-temperature compensation circuit in a low temperature. However, it is difficult to operate both the circuits in combination and obtain an easy and simple configuration.

SUMMARY OF THE INVENTION

A need thus exists for a temperature-compensated crystal oscillator capable of improving temperature compensation accuracy even in a high temperature without increasing a sensitivity of the voltage-controlled crystal oscillator.

According to an aspect of the disclosure, there is provided a temperature-compensated crystal oscillator including: a crystal resonator; and an oscillator circuit for performing temperature compensation, the oscillator circuit having a temperature sensor unit that measures an ambient temperature of the crystal resonator, a temperature compensation unit that outputs a first voltage for temperature compensation based on the measured temperature, a high-temperature load capacitance adjustment unit that outputs a second voltage for temperature compensation based on the temperature measured in a high temperature area exceeding a particular temperature range, an oscillator unit having first and second variable capacitance elements used for temperature compensation within a particular temperature range, third and fourth variable capacitance elements used for temperature compensation in the high temperature area, and an oscillation integrated circuit (IC) connected to the crystal resonator to perform an oscillation operation so that temperature compensation is performed using the first voltage, and temperature compensation is also performed using the second voltage in the high temperature area, and a buffer that amplifies the output from the oscillator unit.

BRIEF DESCRIPTION OF THE DRAWINGS

The foregoing and additional features and characteristics of this disclosure will become more apparent from the following detailed description considered with the reference to the accompanying drawings, wherein:

FIGS. 3A to 3E are explanatory diagrams illustrating an example of temperature compensation of the oscillator circuit according to an embodiment of the disclosure;

DETAILED DESCRIPTION OF EMBODIMENTS

Embodiments of the disclosure will be described in detail with reference to the accompanying drawings.

Overview of Embodiments

In a temperature-compensated crystal oscillator according to an embodiment of the disclosure, an automatic frequency control unit sets the external reference signal to a suitable voltage, an oscillator unit causes a crystal resonator to oscillate using a signal from the automatic frequency control unit, a temperature sensor unit measures an ambient temperature of the crystal resonator in a typical temperature range, a temperature compensation unit outputs a first voltage for temperature compensation to the oscillator unit based on the temperature measured by the temperature sensor unit, and a high-temperature load capacitance adjustment unit outputs a second voltage for temperature compensation for a high temperature to the oscillator unit based on the temperature measured by the high-temperature temperature sensor unit in a high temperature area exceeding the typical temperature range, so that temperature compensation is performed using the first voltage in the typical temperature range and using the first and second voltages in the high temperature area. As a result, it is possible to implement a temperature-compensated crystal oscillator capable of operating across a wide range with low cost without increasing a voltage control sensitivity of the voltage-controlled crystal oscillator.

Figure 1:
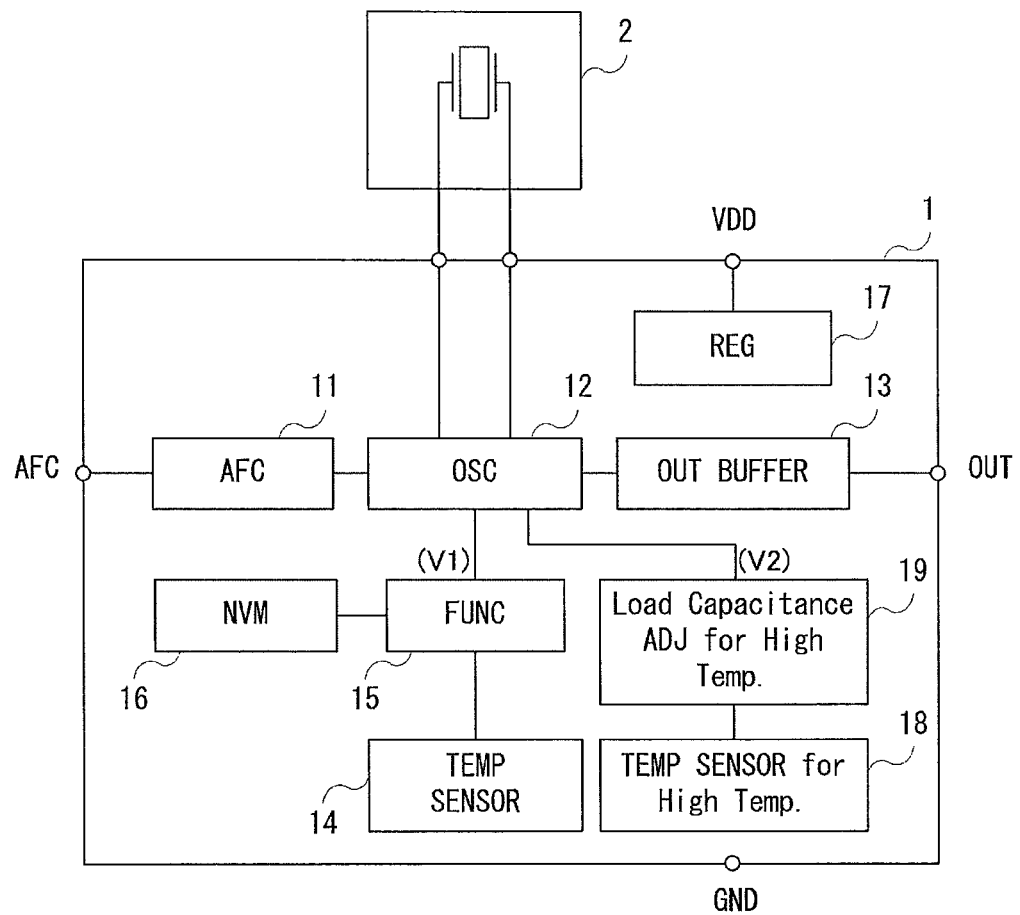
FIG. 1 is a circuit block diagram illustrating a temperature-compensated crystal oscillator according to an embodiment of the disclosure.

<Oscillator: FIG. 1>

The temperature-compensated crystal oscillator according to an embodiment of the disclosure will be described with reference to FIG. 1. FIG. 1 is a circuit block diagram illustrating the temperature-compensated crystal oscillator according to an embodiment of the disclosure. The temperature-compensated crystal oscillator according to an embodiment of the disclosure includes an oscillator circuit 1 and a crystal resonator 2 as illustrated in FIG. 1. The oscillator circuit 1 basically includes an input terminal (AFC terminal) that receives an external reference signal, an automatic frequency control unit (AFC) 11, an oscillator unit (OSC) 12, an output buffer unit (OUT BUFFER) 13, a temperature sensor unit (TEMP SENSOR) 14, a temperature compensation unit (FUNC) 15, a nonvolatile memory (NVM) 16, a constant voltage power source (REG) 17, a high-temperature temperature sensor unit (TEMP SENSOR for High Temp.) 18, and a high-temperature load capacitance adjustment unit (Load Capacitance ADJ for High Temp.) 19.

<Each Unit of Oscillator: FIG. 1>

Each unit of the oscillator according to an embodiment of the disclosure will be described in detail. The automatic frequency control unit 11 adjusts a voltage of the external reference signal input from the AFC terminal to a target sensitivity and outputs it to the oscillator unit 12.

The oscillator unit 12 is connected to the crystal resonator 2 and performs control to output a target frequency using the signal from the AFC 11. In addition, temperature compensation is performed using the temperature compensation voltage V1 output from the frequency/temperature compensation unit 15. Furthermore, temperature compensation is performed using the temperature compensation voltage V2 for adjusting the high-temperature load capacitance from the high-temperature load capacitance adjustment unit 19. Therefore, the oscillator unit 12 has a configuration capable of adjusting the high-temperature load capacitance unlike the oscillator unit in prior art as described below so that the load capacitance is changed depending on the input of the temperature compensation voltage V2.

That is, while temperature compensation is performed using a voltage based on the temperature compensation voltage V1 from the temperature compensation unit 15 in a typical temperature range (e.g., −40 to +85° C.), temperature compensation is performed using a voltage based on the temperature compensation voltage V2 from the high-temperature load capacitance adjustment unit 19 in addition to the temperature compensation voltage V1 in a high temperature range (e.g., +86 to +105° C.).

The output buffer unit 13 amplifies (or buffers) the oscillation signal from the oscillator unit 12 and outputs it to the output terminal (OUT terminal). Here, the output buffer unit 13, the crystal resonator 2, and the oscillator unit 12 constitute a voltage-controlled crystal oscillator (VCXO).

The temperature sensor unit 14 measures an ambient temperature of the crystal resonator 2 and outputs the temperature measurement value to the temperature compensation unit 15. The temperature compensation unit 15 is a circuit for generating a function. The temperature compensation unit 15 reads a temperature compensation parameter stored in the nonvolatile memory 16, performs computation based on the parameter and the temperature measurement value input from the temperature sensor unit 14, and outputs the temperature compensation voltage V1 to the oscillator unit 12.

The nonvolatile memory 16 stores the temperature compensation parameter used in the computation process in the temperature compensation unit 15. It is noted that the parameter may arbitrarily change depending on a characteristic of the oscillator. The constant voltage power source 17 generates a constant voltage for a voltage variation of the external voltage to operate the oscillator stably.

The high-temperature temperature sensor unit 18 is a temperature sensor circuit capable of operating at a high temperature (e.g., 85° C. or higher). The high-temperature temperature sensor unit 18 measures an ambient temperature of the crystal resonator and outputs the measurement temperature value to the high-temperature load capacitance adjustment unit 19. The high-temperature temperature sensor unit 18 may be substituted with the temperature sensor unit 14. However, if a wide temperature range is utilized using the same power voltage, measurement accuracy in a typical temperature range is degraded. Therefore, in order to improve measurement accuracy in a high temperature area, it is preferable to use a temperature sensor circuit dedicated to a high temperature.

The high-temperature load capacitance adjustment unit 19 outputs the temperature compensation voltage V2 corresponding to the temperature value measured by the high-temperature temperature sensor unit 18 to the oscillator unit 12, in order to adjust the high-temperature load capacitance. The high-temperature load capacitance adjustment unit 19 computes a value of the temperature compensation voltage V2 based on the measurement temperature value input from the high-temperature temperature sensor unit 18. However, similar to the temperature compensation unit 15, the high-temperature load capacitance adjustment unit 19 may perform a computation process by reading a temperature compensation parameter for a high temperature from the nonvolatile memory 16. Since the parameter stored in the nonvolatile memory 16 can change depending on a characteristic of the oscillator, the high-temperature load capacitance adjustment unit 19 preferably reads the temperature compensation parameter from the nonvolatile memory 16 and then uses it for computation, which gives wide utility.

Figure 2:
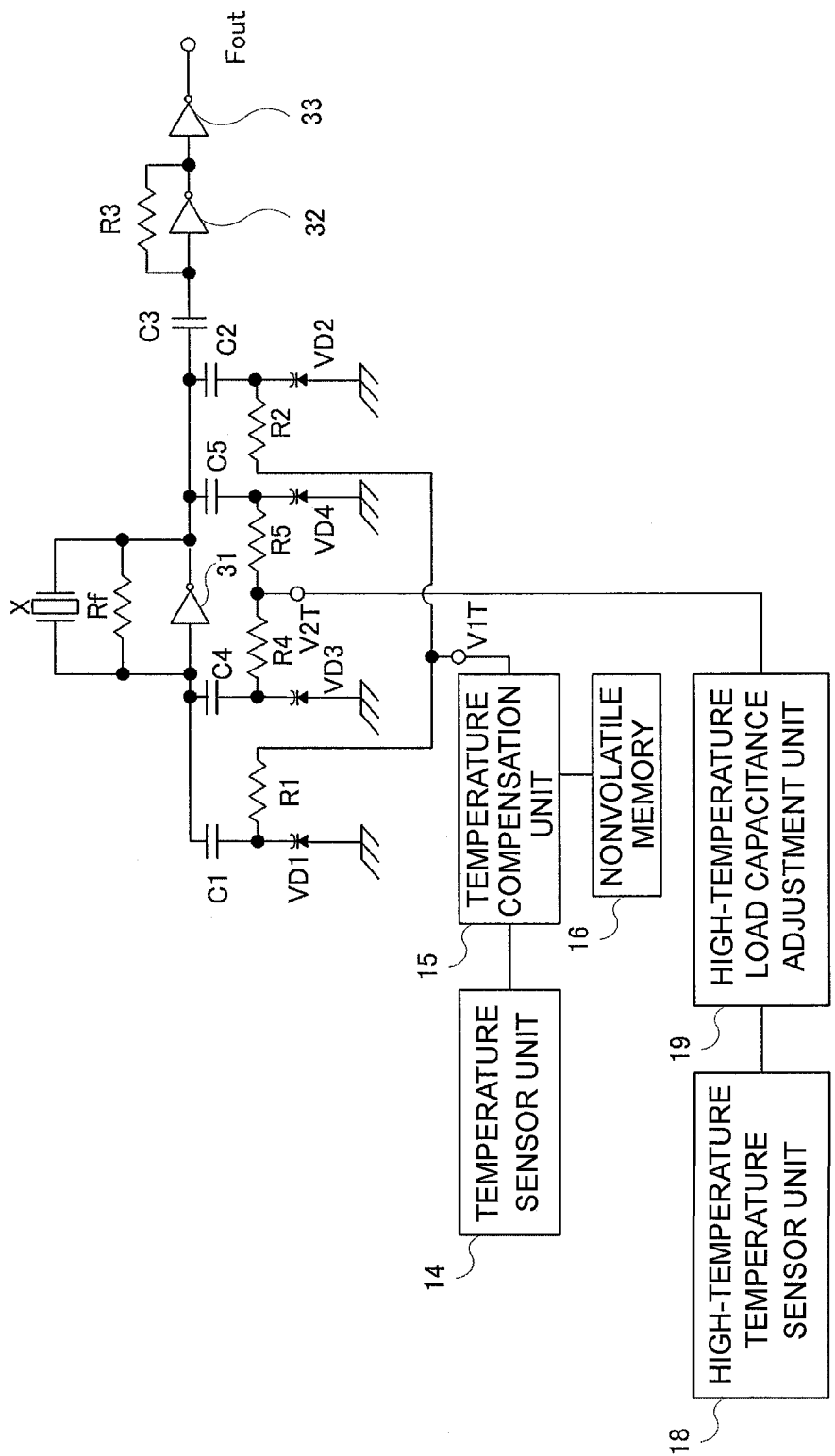
FIG. 2 is a circuit diagram illustrating an oscillator according to an embodiment of the disclosure.
Figure 4:
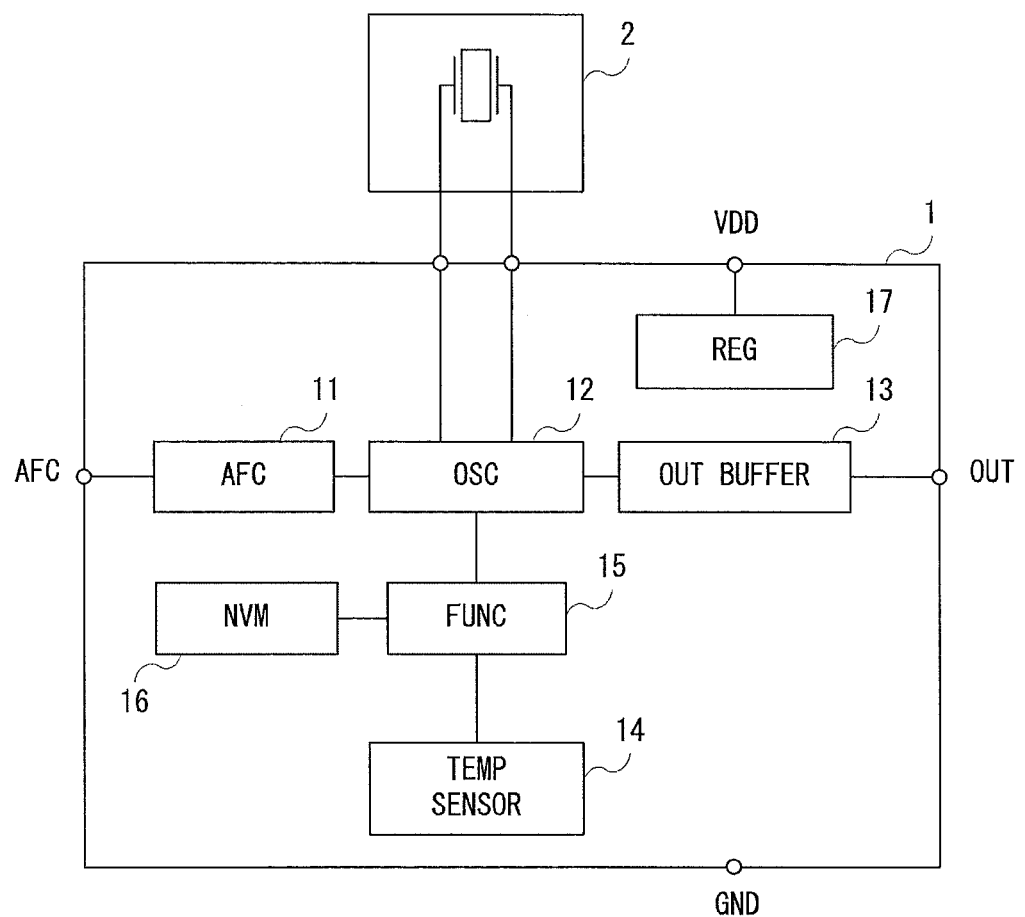
FIG. 4 is a circuit block diagram illustrating a temperature-compensated crystal oscillator in prior art.
Figure 5:
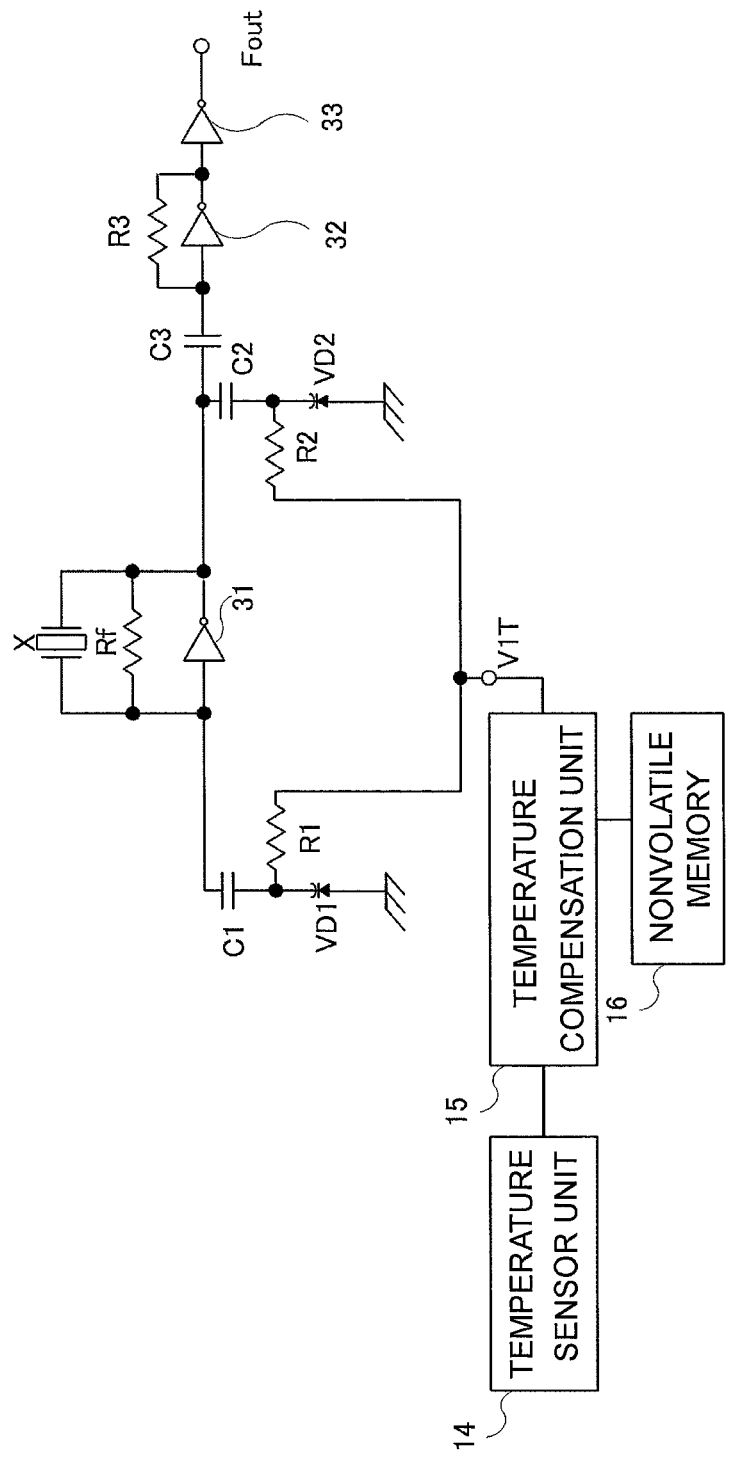
FIG. 5 is a circuit diagram illustrating a temperature-compensated crystal oscillator in prior art.
Figures 6A, 6B, 6C, 6D:
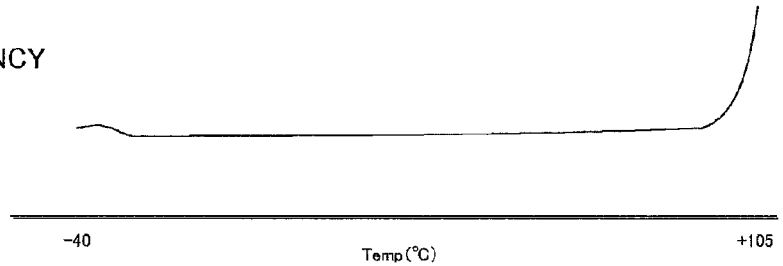
FIGS. 6A to 6D are explanatory diagrams illustrating an example of temperature compensation in prior art.

<Circuit of Oscillator: FIG. 2>

Next, the circuit of the oscillator according to an embodiment of the disclosure of FIG. 1 will be described with reference to FIG. 2. FIG. 2 is a circuit diagram illustrating the oscillator according to an embodiment of the disclosure. In the oscillator, comparing FIGS. 1 and 2, the crystal resonator 2 corresponds to the crystal resonator X, and the output buffer unit 13 corresponds to the buffers 32 and 33, the resistor R3, and the capacitor C3.

In addition, the oscillator unit 12 corresponds to the inverter IC31, the resistors Rf, R1, and R2, the capacitors C1 and C2, the first and second variable capacitance diodes VD1 and VD2. A configuration for adjusting the high-temperature load capacitance corresponds to the capacitors C4 and C5, the resistors R4 and R5, and the third and fourth variable capacitance diodes VD3 and VD4. The inverter IC31 is an oscillation IC which outputs an inverted input signal.

It is noted that the automatic frequency control unit 11 and the constant voltage power source 17 of FIG. 1 are omitted from FIG. 2, and the output from the automatic frequency control unit 11 is input to the terminal portion for the voltage V1T of FIG. 2.

<Circuit Connection Relationship in Oscillator>

Next, a circuit connection relationship in the oscillator according to an embodiment of the disclosure will be described. First, in the oscillator unit 12, the input and output sides of the inverter IC31 are connected to both sides of the crystal resonator X, and the resistor Rf is connected to the crystal resonator X in parallel. One end of the capacitor C1 is connected to the input side of the inverter IC31, and the other end thereof is connected to one end of the first variable capacitance diode VD1. The other end of the first variable capacitance diode VD1 is grounded. In addition, one end of the capacitor C4 is connected to the input side of the inverter IC31, and the other end thereof is connected to one end of the third variable capacitance diode VD3. The other end of the third variable capacitance diode VD3 is grounded.

One end of the capacitor C2 is connected to the output side of the inverter IC31, and the other end thereof is connected to one end of the second variable capacitance diode VD2. The other end of the second variable capacitance diode VD2 is grounded. In addition, one end of the capacitor C5 is connected to the output side of the inverter IC31, and the other end thereof is connected to one end of the fourth variable capacitance diode VD4. The other end of the fourth variable capacitance diode VD4 is grounded. Furthermore, the capacitor C3 is connected to the output side of the inverter IC31 in series, and the buffers 32 and 33 are connected to the output terminal (Fout) in series through the capacitor C3. It is noted that the output of the buffer 32 is fed back to the input through the resistor R3.

In addition, the other end of the capacitor C1 is connected to the terminal V1T through the resistor R1, and the other end of the capacitor C2 is also connected to the terminal V1T through the resistor R2. The output terminal of the temperature compensation unit 15 is connected to the terminal V1T, and the temperature compensation unit 15 is accessibly connected to the nonvolatile memory 16, so that the measurement temperature from the temperature sensor unit 14 can be input.

The other end of the capacitor C4 is connected to the terminal V2T through the resistor R4, and the other end of the capacitor C5 is connected to the terminal V2T through the resistor R5. In addition, the output terminal of the high-temperature load capacitance adjustment unit 19 is connected to the terminal V2T, so that the high-temperature load capacitance adjustment unit 19 receives the high-temperature measurement temperature from the high-temperature temperature sensor unit 18.

<Operation of Oscillator Circuit>
<Typical Temperature Range>

In operation of the oscillator circuit according to an embodiment of the disclosure, the temperature value measured by the temperature sensor unit 14 is input to the temperature sensor unit 15 in a typical temperature range (e.g., −40 to +85° C.), so that a value of the temperature compensation voltage is computed, and the temperature compensation voltage V1 is output to the terminal V1T.

A signal from the AFC 11 is input to the terminal V1T, and the temperature compensation voltage V1 is also added. The capacitances of the first and second variable capacitance diodes VD1 and VD2 change depending on the signal from the AFC 11 and the temperature compensation voltage V1 through the resistors R1 and R2, so that the inverter IC31 performs the oscillation operation.

<High Temperature Area>

In a high-temperature area (e.g., +86 to +105° C.), the temperature sensor unit 14 and the temperature compensation unit 15 continue to operate. In addition, the high-temperature temperature sensor unit 18 and the high-temperature load capacitance adjustment unit 19 start operation to output a temperature compensation voltage V2 for a high temperature area to the terminal V2T.

Then, the capacitances of the third and fourth variable capacitance diodes VD3 and VD4 change through the resistors R4 and R5 so as to change the load capacitance. The load capacitance changes depending on a value of the temperature compensation voltage V2 output from the high-temperature load capacitance adjustment unit 19 and is adjusted by the high-temperature load capacitance adjustment unit 19. Specifically, temperature compensation in a high temperature area is performed by gradually lowering the temperature compensation voltage V2 and gradually increasing the high-temperature load.

Since the high-temperature load capacitance is formed inside the oscillator unit 12, it is possible to perform temperature compensation in a high temperature area. Therefore, it is possible to implement a low-noise temperature-compensated crystal oscillator capable of operating across a wide temperature range with low cost without increasing a sensitivity of the voltage-controlled crystal oscillator.

<Example of Temperature Compensation in Oscillator Circuit: FIGS. 3A-3E>

An example of temperature compensation in the oscillator circuit according to an embodiment of the disclosure will be described with reference to FIGS. 3A to 3E. FIGS. 3A to 3E are explanatory diagrams illustrating an example of temperature compensation in the oscillator circuit. In FIGS. 3A to 3E, the abscissa denotes a temperature (Temp), and the ordinate denotes a frequency characteristic in FIGS. 3A and 3E and a voltage characteristic in FIGS. 3B, 3C, and 3D. FIG. 3A illustrates a characteristic of the oscillation frequency Fout without temperature compensation. This characteristic corresponds to a frequency characteristic depending on the temperature characteristics of the crystal resonator and the oscillator circuit.

FIG. 3B illustrates a voltage characteristic of an ideal temperature compensation voltage V1, and FIG. 3C illustrates a voltage characteristic of a realistic temperature compensation voltage V1. In addition, FIG. 3D illustrates a voltage characteristic of the load capacitance correction voltage V2, and FIG. 3E illustrates a characteristic of the oscillation frequency Fout after temperature compensation in the oscillator circuit.

Although a deviation is generated in a high temperature area between the voltage characteristic of the ideal temperature compensation voltage of FIG. 3B and the voltage characteristic of the realistic temperature compensation voltage of FIG. 3C, such a deviation can be removed using the voltage characteristic of the load capacitance correction voltage V2 of FIG. 3D. Therefore, if the voltage characteristic of the realistic temperature compensation voltage of FIG. 3C and the voltage characteristic of the load capacitance correction voltage V2 of FIG. 3D are applied to the oscillation frequency of the voltage-controlled crystal oscillator without temperature compensation in FIG. 3A, the oscillation frequency after temperature compensation of the oscillator circuit becomes nearly flat as illustrated in FIG. 3E. That is, it can be concluded that temperature compensation is normally performed even in the high temperature area.

Although the oscillator disclosed herein has a configuration in which the external reference signal is input, the disclosure may be applicable to an oscillator operating based on an internal voltage without using the external reference signal. In this case, the oscillator circuit 1 does not have the AFC 11. In addition, although the variable capacitance diode is employed as the variable capacitance element in the oscillator disclosed herein, a variable capacitance element using a metal oxide semiconductor (MOS) may be employed.

The temperature-compensated crystal oscillator described above may further include a high-temperature temperature sensor unit that measures a temperature in a high temperature area exceeding a particular temperature range and outputs the measured temperature to the high-temperature load capacitance adjustment unit.

In the temperature-compensated crystal oscillator described above, the high-temperature load capacitance adjustment unit may operate to gradually increase capacitances of the third and fourth variable capacitance elements of the oscillator unit in a high temperature area exceeding a particular temperature range.

In the temperature-compensated crystal oscillator described above, one end of the first variable capacitance element may be connected to one end of the first capacitor provided in an input side of the oscillation IC, the other end of the first variable capacitance element may be grounded, one end of the second variable capacitance element may be connected to one end of the second capacitor provided in an output side of the oscillation IC, the other end of the second variable capacitance element may be grounded, one end of a first resistor may be connected between one end of the first variable capacitance element and one end of the first capacitor, one end of a second resistor may be connected between one end of the second variable capacitance element and one end of the second capacitor, the other end of the first resistor and the other end of the second resistor may be connected to a connection node, and a first voltage from the temperature compensation unit may be input to the connection node.

In the temperature-compensated crystal oscillator described above, one end of the third variable capacitance element may be connected to one end of a third capacitor provided in an input side of the oscillation IC, the other end of the third variable capacitance element may be grounded, one end of a fourth variable capacitance element may be connected to one end of a fourth capacitor provided in an output side of the oscillation IC, the other end of the fourth variable capacitance element may be grounded, one end of a third resistor may be connected between one end of the third variable capacitance element and one end of the third capacitor, one end of a fourth resistor may be connected between one end of the fourth variable capacitance element and one end of the fourth capacitor, the other end of the third resistor and the other end of the fourth resistor may be connected to a connection node, and a second voltage from the high-temperature load capacitance adjustment unit is input to the connection node.

Advantages of Embodiments

According to this disclosure, a temperature-compensated crystal oscillator includes an oscillator circuit having a temperature sensor unit that measures an ambient temperature of the crystal resonator, a temperature compensation unit that outputs a first voltage for temperature compensation based on the measured temperature, a high-temperature load capacitance adjustment unit that outputs a second voltage for temperature compensation based on the temperature measured in a high temperature area exceeding a particular temperature range, an oscillator unit having first and second variable capacitance elements used for temperature compensation within a particular temperature range, third and fourth variable capacitance elements used for temperature compensation in the high temperature area, and an oscillation integrated circuit (IC) connected to the crystal oscillator to perform an oscillation operation so that temperature compensation is performed using the first voltage, and temperature compensation is also performed using the second voltage in the high temperature area, and a buffer that amplifies the output from the oscillator unit. Therefore, it is possible to improve temperature compensation accuracy even in a high temperature without increasing a voltage control sensitivity of the voltage-controlled crystal oscillator.

The oscillator disclosed herein performs temperature compensation in the oscillator unit 12 by operating the temperature sensor unit 14 and the temperature compensation unit 15 in a typical temperature range. However, in a high temperature area exceeding the typical temperature range, high-temperature temperature compensation is performed in the oscillator unit 12 by operating the high-temperature temperature sensor unit 18 and the high-temperature load capacitance adjustment unit 19 in addition to the temperature sensor unit 14 and the temperature compensation unit 15. Therefore, it is possible to provide a low-noise temperature-compensated crystal oscillator capable of operating across a wide range with low cost without increasing a control sensitivity of the voltage-controlled crystal oscillator.

This disclosure may be applicable to a low-noise temperature-compensated crystal oscillator capable of improving temperature compensation accuracy even in a high temperature without increasing a control sensitivity of the voltage-controlled crystal oscillator.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A temperature-compensated crystal oscillator comprising:
   a crystal resonator; and
   an oscillator circuit for performing temperature compensation,
   the oscillator circuit having
      a temperature sensor unit that measures an ambient temperature of the crystal resonator,
      a temperature compensation unit, to which the temperature sensor unit outputs the measured temperature, outputs a first voltage for temperature compensation based on the measured temperature,
      a high-temperature temperature sensor unit that measures an ambient temperature of the crystal resonator in a high temperature area exceeding a particular temperature range,
      a high-temperature load capacitance adjustment unit, to which the high-temperature temperature sensor unit outputs the temperature measured in the high temperature area exceeding the particular temperature range, outputs a second voltage for temperature compensation based on the temperature measured in the high temperature area exceeding the particular temperature range,
      an oscillator unit having first and second variable capacitance elements used for temperature compensation within the particular temperature range, and third and fourth variable capacitance elements used for temperature compensation in the high temperature area, wherein the oscillator has only two voltage input terminals including a first input terminal and a second input terminal, so that temperature compensation is performed by inputting the first voltage through the first input terminal, and temperature compensation is also performed by inputting the second voltage in the high temperature area through the second input terminal, an end of the first variable capacitance element and an end of the second variable capacitance element are directly grounded, and an end of the third variable capacitance element and fourth variable capacitance element are directly grounded, and
      a buffer that amplifies the output from the oscillator unit.

2. The temperature-compensated crystal oscillator according to claim 1, wherein the high-temperature load capacitance adjustment unit operates to gradually increase capacitances of the third and fourth variable capacitance elements of the oscillator unit in a high temperature area exceeding a particular temperature range.

3. The temperature-compensated crystal oscillator according to claim 2, wherein one end of the first variable capacitance element is connected to one end of a first capacitor, the other end of the first variable capacitance element is grounded, one end of the second variable capacitance element is connected to one end of the second capacitor, the other end of the second variable capacitance element is grounded, one end of a first resistor is connected between one end of the first variable capacitance element and one end of the first capacitor, one end of a second resistor is connected between one end of the second variable capacitance element and one end of the second capacitor, the other end of the first resistor and the other end of the second resistor are connected to a first connection node serving as the first input terminal, and the first voltage from the temperature compensation unit is input to the first connection node.

4. The temperature-compensated crystal oscillator according to claim 1, wherein one end of the first variable capacitance element is connected to one end of a first capacitor, the other end of the first variable capacitance element is grounded, one end of the second variable capacitance element is connected to one end of the second capacitor, the other end of the second variable capacitance element is grounded, one end of a first resistor is connected between one end of the first variable capacitance element and one end of the first capacitor, one end of a second resistor is connected between one end of the second variable capacitance element and one end of the second capacitor, the other end of the first resistor and the other end of the second resistor are connected to a first connection node serving as the first input terminal, and the first voltage from the temperature compensation unit is input to the first connection node.

5. The temperature-compensated crystal oscillator according to claim 1, wherein one end of the third variable capacitance element is connected to one end of a third capacitor, the other end of the third variable capacitance element is grounded, one end of a fourth variable capacitance element is connected to one end of a fourth capacitor, the other end of the fourth variable capacitance element is grounded, one end of a third resistor is connected between one end of the third variable capacitance element and one end of the third capacitor, one end of a fourth resistor is connected between one end of the fourth variable capacitance element and one end of the fourth capacitor, the other end of the third resistor and the other end of the fourth resistor are connected to a second connection node serving as the second input terminal, and the second voltage from the high-temperature load capacitance adjustment unit is input to the second connection node.

* * * * *